US010141142B2

(12) United States Patent
Curtis

(10) Patent No.: US 10,141,142 B2
(45) Date of Patent: Nov. 27, 2018

(54) MULTIPLE FREQUENCY TONE MONITOR

(71) Applicant: Intermountain Electronics, Inc., Price, UT (US)

(72) Inventor: Dale V. Curtis, Castle Dale, UT (US)

(73) Assignee: Intermountain Electronics, Inc., Price, UT (US)

( * ) Notice: Subject to any disclaimer, the term of this patent is extended or adjusted under 35 U.S.C. 154(b) by 230 days.

(21) Appl. No.: 15/215,502

(22) Filed: Jul. 20, 2016

(65) Prior Publication Data

US 2017/0138991 A1    May 18, 2017

Related U.S. Application Data

(60) Provisional application No. 62/254,353, filed on Nov. 12, 2015.

(51) Int. Cl.
| *H01H 35/00* | (2006.01) |
| *H01H 83/00* | (2006.01) |
| *H02H 3/00* | (2006.01) |
| *H01H 47/00* | (2006.01) |
| *H02H 3/17* | (2006.01) |
| *G01R 31/02* | (2006.01) |

(52) U.S. Cl.
CPC .............. *H01H 47/00* (2013.01); *H02H 3/17* (2013.01); *G01R 31/025* (2013.01)

(58) Field of Classification Search
CPC ......... H01H 47/00; H02H 3/17; G01R 31/025
USPC ....................................................... 307/131
See application file for complete search history.

(56) References Cited

U.S. PATENT DOCUMENTS

| 3,335,324 A | 10/1965 | Buckeridge |
| 3,995,200 A | 11/1976 | Stolarczyk |
| 4,228,475 A | 10/1980 | Sherwood |
| 4,295,175 A | 10/1981 | Cordray |
| 4,415,850 A | 11/1983 | Sherwood |
| 4,609,865 A | 9/1986 | Goodman |
| 4,638,244 A | 1/1987 | Howell |
| 4,991,105 A | 2/1991 | Pimental |
| 5,177,657 A | 1/1993 | Baer |
| 5,576,920 A | 11/1996 | Kosuga |

(Continued)

OTHER PUBLICATIONS

U.S. Appl. No. 13/907,019 Office Action, dated Jan. 2, 2015.

(Continued)

*Primary Examiner* — Carlos Amaya
(74) *Attorney, Agent, or Firm* — Kunzler, PC

(57) ABSTRACT

An apparatus for monitoring ground current includes a signal generation module that generates a plurality of AC components of different frequencies. An injection module injects the plurality of AC components on one or more phases of a set of power cables connecting a power source to a load. The set of power cables includes an equipment grounding conductor. The AC components are injected in the equipment grounding conductor. An AC detection module that determines an AC current corresponding to each frequency of the AC components present in current in the equipment grounding conductor, an AC threshold module determines if one or more of the AC currents is below an AC threshold, and a trip module opens a contact if the AC threshold module determines that at least one of the AC currents is below an AC threshold. The contact disconnects the power source from the power cables.

24 Claims, 6 Drawing Sheets

(56) References Cited

U.S. PATENT DOCUMENTS

| | | | |
|---|---|---|---|
| 5,644,461 | A | 7/1997 | Miller |
| 8,149,552 | B1 | 4/2012 | Cordill |
| 8,841,917 | B2 | 9/2014 | Wei |
| 9,197,055 | B2 | 11/2015 | Curtis |
| 9,541,594 | B2 * | 1/2017 | Curtis .................. G01R 31/025 |
| 9,541,595 | B2 * | 1/2017 | Curtis .................. G01R 31/025 |
| 9,541,596 | B2 * | 1/2017 | Curtis .................. G01R 31/025 |
| 9,547,032 | B2 * | 1/2017 | Curtis .................. G01R 31/025 |
| 2003/0155928 | A1 | 8/2003 | Roden |
| 2007/0159750 | A1 | 7/2007 | Perker |

OTHER PUBLICATIONS

U.S. Appl. No. 13/907,057 Office Action, dated Feb. 6, 2015.
Line Power, Groundkeeper 145 Continuity Type Ground Monitor, http://linepower.com/literature/pdf/LPMS-GK145, 1993.
Service Machine, SMC C54-004 and C54-005 Series Ground Monitors, Publication Date: Feb. 2, 1993.
U.S. Appl. No. 13/906,807, filed May 31, 2015, Office Action dated Apr. 9, 2015.
U.S. Appl. No. 13/907,019, filed May 31, 2013, Notice of Allowance dated Jun. 22, 2015.
U.S. Appl. No. 13/907,057, filed May 31, 2013, Notice of Allowance dated Jun. 5, 2015.
U.S. Appl. No. 13/906,807, filed May 31, 2013, Notice of Allowance dated Aug. 17, 2015.
U.S. Appl. No. 14/473,568, filed Aug. 29, 2014, Office Action dated Jun. 14, 2016.
U.S. Appl. No. 14/823,959, filed Aug. 11, 2015, Office Action dated Jun. 16, 2016.
U.S. Appl. No. 14/824,006, filed Aug. 11, 2015, Office Action dated Jun. 16, 2016.
U.S. Appl. No. 14/824,038, filed Aug. 11, 2015, Office Action dated Jun. 15, 2016.

* cited by examiner

MULTIPLE FREQUENCY TONE MONITOR

CROSS-REFERENCES TO RELATED APPLICATIONS

This application claims the benefit of U.S. Provisional Patent Application No. 62/254,353 entitled "Multiple Frequency Tone Monitor" and filed on Nov. 12, 2015 for Dale V. Curtis, which is incorporated herein by reference.

FIELD

This invention relates to ground current monitoring and more particularly relates to ground current monitoring using a tone monitor in various power systems, such as for mining applications.

BACKGROUND

Mining is a very special environment that is by its very nature hazardous. Mine shafts are very limited physically, often include wet conditions, and can have explosive gases and dust. The mining industry has a long history of accidents and fatalities. As a result, governmental regulations as well as company policies are geared toward making mining safer for those that enter and work in mines. One governmental agency that regulates mining practice in the United States is the Mine Safety and Health Administration ("MSHA"). MSHA provides regulations as well as enforcement of the regulations. Other countries have similar organizations.

Mining equipment is typically large and requires a significant amount of power. Mining equipment is also typically portable. To provide power to the mining equipment, portable power sources are provided in and around mines. Due to the high power requirements of mining equipment as well as mines having long shafts, often mining power source have voltages that are higher than are typically found in industrial situations. It is not uncommon for the mining power sources to provide power with voltages being about 1 kilo volt ("KV"). In addition, due to the portability of the mining equipment and power sources, often power is provided using flexible cables run without conduit. Due to the high voltages, exposed cables, wet conditions, etc., special consideration must be made for safety of the electrical power systems in mining.

One way to increase safety and reliability of mining power systems is to determine if equipment grounding conductors are in place and properly connected. When equipment grounding conductors are not properly connected, have short circuits, etc., when a fault condition occurs electrical current can flow through the earth surrounding mine shafts as well as through mining equipment. Current flowing in unintended routes create a shock hazard for miners both for fault conditions before overcurrent protection reacts as well as steady state conditions when continuous current flow in unintended paths.

MSHA has provided regulations for monitoring current in grounding conductors. MSHA regulations regarding ground current were changed several years ago. Much of the electrical power system equipment in use today in mines today does not meet current MSHA requirements found in testing standard 30 of the Code of Federal Regulations ("C.F.R.") section 75 and 30 C.F.R. section 77 with respect to ground current monitoring. While most mining applications include a set of power cables that include a pilot wire for transmitting ground monitor signals, in addition to the phase conductors and equipment grounding conductor, there are many applications without a pilot wire. Typically, such systems include a ground monitor apparatus that uses very old technology.

SUMMARY

An apparatus for monitoring ground current is disclosed. A system and method also perform the functions of the apparatus. The apparatus includes a signal generation module that generates a plurality of alternating current ("AC") components, where each of the plurality of AC components includes a different frequency. The apparatus, in one embodiment, includes an injection module that injects the plurality of AC components on one or more phases of a set of power cables connecting a power source to a load. The set of power cables includes an equipment grounding conductor, where the AC components are injected in the equipment grounding conductor. The apparatus, in one example, includes an AC detection module that determines an AC current corresponding to each frequency of the one or more AC components present in current in the equipment grounding conductor, an AC threshold module that determines if one or more of the AC currents determined by the AC detection module is below an AC threshold, and a trip module that opens a contact in response to the AC threshold module determining that at least one of the AC currents is below an AC threshold. The contact disconnects the power source from the set of power cables.

In one embodiment, the apparatus includes a ground injection module that filters the AC components present in the one or more phases of the set of power cables and injects the AC components in the equipment grounding conductor. In a further embodiment, the ground injection module is located in the load. In another embodiment, the injection module includes one or more band pass filters, where each band pass filter of the one or more band pass filters is tuned to pass one or more of the AC components. In another embodiment, a frequency of each of the AC components differs from a fundamental frequency of power transmitted on the set of power cables.

In one embodiment, the AC detection module includes a fundamental frequency filter that filters out a fundamental frequency of power transmitted on the set of power cables. In a further embodiment, the fundamental frequency filter includes a comb filter tuned to filter out the fundamental frequency and harmonic frequencies of the power transmitted on the set of power cables. In another embodiment, the AC detection module includes one or more filters for each AC component. The one or more filters of an AC component attenuate frequencies other than a frequency of the AC component. In one example, the one or more filters for each AC component include digital signal processing ("DSP") filters. In another example, the one or more filters for each AC component include a band pass filter and/or a parametric filter. In another embodiment, the trip module compares each AC component to an AC threshold.

In one embodiment, the apparatus includes a change module that periodically changes an AC component characteristic of one or more of the plurality of AC components, and an update module that changes an AC component characteristic sensed for one or more of the plurality of AC components to match the changed AC component characteristics of the AC components changed by change module in response to the change module changing the AC component characteristic of one or more of the plurality of AC components. In one example, the change module changes an AC component characteristic of one or more of the plurality of AC components by changing a frequency of one or more of the plurality of AC components and the update module changes the AC component characteristic sensed for one or more of the plurality of AC components by changing a sensed frequency to match the frequencies of the plurality of AC components changed by the change module. In another example, the change module changes an AC component characteristic of one or more of the plurality of AC components by changing a phase of one or more of the plurality of AC components and the update module changes the AC component characteristic sensed for one or more of the plurality of the AC components by changing a sensed phase to match the phases of the plurality of AC components changed by the change module.

In another embodiment, the apparatus includes a sync module that synchronizes changes in sensing by the update module with changes to the AC component characteristic of each of the plurality of AC components by the change module. In another embodiment, the change module changes the AC component characteristic of one or more of the plurality of AC components by ramping from a current frequency to a new frequency over a period of time, and/or ramping from a current phase to a new phase over a period of time. In another embodiment, the change module changes the AC component characteristic of one or more of the plurality of AC components randomly. In a further embodiment, the change module calculates coefficients for an oscillator corresponding to each AC component to generate the random frequency for each of the AC components changed by the change module and the AC detection module calculates coefficients for a filter to match the random frequency for each of the one or more AC components changed by the update module. In another embodiment, the apparatus includes a frequency test module that determines if a frequency is present on the equipment grounding conductor prior to selecting the frequency for an AC component. In another embodiment, the apparatus includes a calibration module that determines a baseline amplitude for each of the plurality of AC components and sets, for each AC component, an AC threshold based on the determined baseline amplitude of the AC component.

A system for monitoring ground current includes a power source and a ground monitor in the power source. The ground monitor includes a signal generation module that generates a plurality of AC components, where each of the plurality of AC components comprising a different frequency, and an injection module that injects the plurality of AC components on one or more phases of a set of power cables connecting a power source to a load. The set of power cables includes an equipment grounding conductor, and the AC components are injected in the equipment grounding conductor. The ground monitor, in one embodiment, includes an AC detection module that determines an AC current corresponding to each frequency of the one or more AC components present in current in the equipment grounding conductor, an AC threshold module that determines if one or more of the AC currents determined by the AC detection module is below an AC threshold, and a trip module that opens a contact in response to the AC threshold module determining that at least one of the AC currents is below an AC threshold. The contact disconnecting the power source from the set of power cables. In one embodiment, the system includes a ground injection module that filters the AC components present in the one or more phases of the set of power cables and injects the AC components in the equipment grounding conductor.

A method for monitoring ground current includes generating a plurality of AC components, where each of the plurality of AC components includes a different frequency. The method includes, in one embodiment, injecting the plurality of AC components on one or more phases of a set of power cables connecting a power source to a load. The set of power cables include an equipment grounding conductor, where the AC components are injected in the equipment grounding conductor. The method, in one embodiment, includes determining an AC current corresponding to each frequency of the one or more AC components present in current in the equipment grounding conductor, determining if one or more of the determined AC currents is below an AC threshold, and opening a contact in response to determining that at least one of the AC currents is below an AC threshold. The contact disconnects the power source from the set of power cables. In another embodiment, the method includes filtering the AC components present in the one or more phases of the set of power cables and injecting the AC components in the equipment grounding conductor.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION

Figure 1:
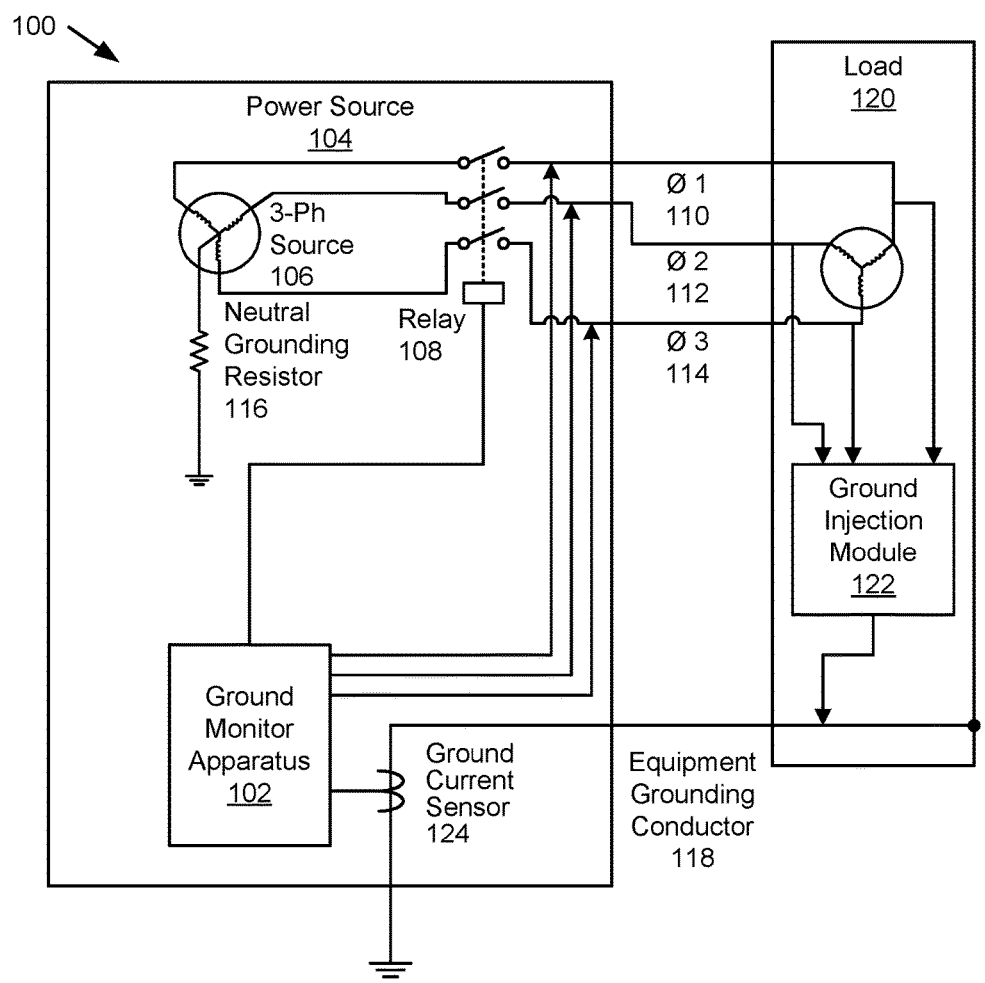
FIG. 1 is schematic block diagram depicting one embodiment of a system for monitoring ground current.

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Furthermore, the described features, advantages, and characteristics of the embodiments may be combined in any suitable manner. One skilled in the relevant art will recognize that the embodiments may be practiced without one or more of the specific features or advantages of a particular embodiment. In other instances, additional features and advantages may be recognized in certain embodiments that may not be present in all embodiments.

These features and advantages of the embodiments will become more fully apparent from the following description and appended claims, or may be learned by the practice of embodiments as set forth hereinafter. As will be appreciated by one skilled in the art, aspects of the present invention may be embodied as a system, method, and/or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module," or "system." Furthermore, aspects of the present invention may take the form of a computer program product embodied in one or more computer readable medium(s) having program code embodied thereon.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software as executable code for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. Where a module or portions of a module are implemented in software, the executable code of the software may be stored and/or propagated on in one or more computer readable medium(s).

The computer program product may include a computer readable storage medium (or media) having computer readable program instructions (executable code) thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory ("RAM"), a read-only memory ("ROM"), an erasable programmable read-only memory ("EPROM" or Flash memory), a static random access memory ("SRAM"), a portable compact disc read-only memory ("CD-ROM"), a digital versatile disk ("DVD"), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture ("ISA") instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on a user's device, partly on the user's device, as a stand-alone software package, partly on the user's device and partly on a remote computer or entirely on the remote computer or server. In the latter scenario, the remote computer may be connected to the user's device through any type of network, including a local area network ("LAN") or a wide area network ("WAN"), or the connection may be made to an external computer (for example, through the Internet using an Internet Service Provider). In some embodiments, electronic circuitry including, for example, programmable logic circuitry, field-programmable gate arrays ("FPGA"), or programmable logic arrays ("PLA") may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions, with hardware circuits or a combination of both.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computing device, other programmable data processing apparatus, or other device to cause a series of operational steps to be performed on the computing device, other programmable apparatus or other device to produce a computer implemented process, such that the instructions which execute on the computer, other programmable apparatus, or other device implement all or some of the functions/acts specified in the flowchart and/or block diagram block or blocks.

It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated Figures.

Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and program code.

FIG. 1 is schematic block diagram depicting one embodiment of a system 100 for monitoring ground current. The system 100 includes a ground monitor apparatus 102, a power source 104, a three-phase power source 106, a relay 108, a first phase 110, a second phase 112, a third phase 114, a neutral grounding resistor 116, an equipment grounding conductor 118, a load 120 with a ground injection module 122, and a ground current sensor 124, which are described below.

Figure 2:
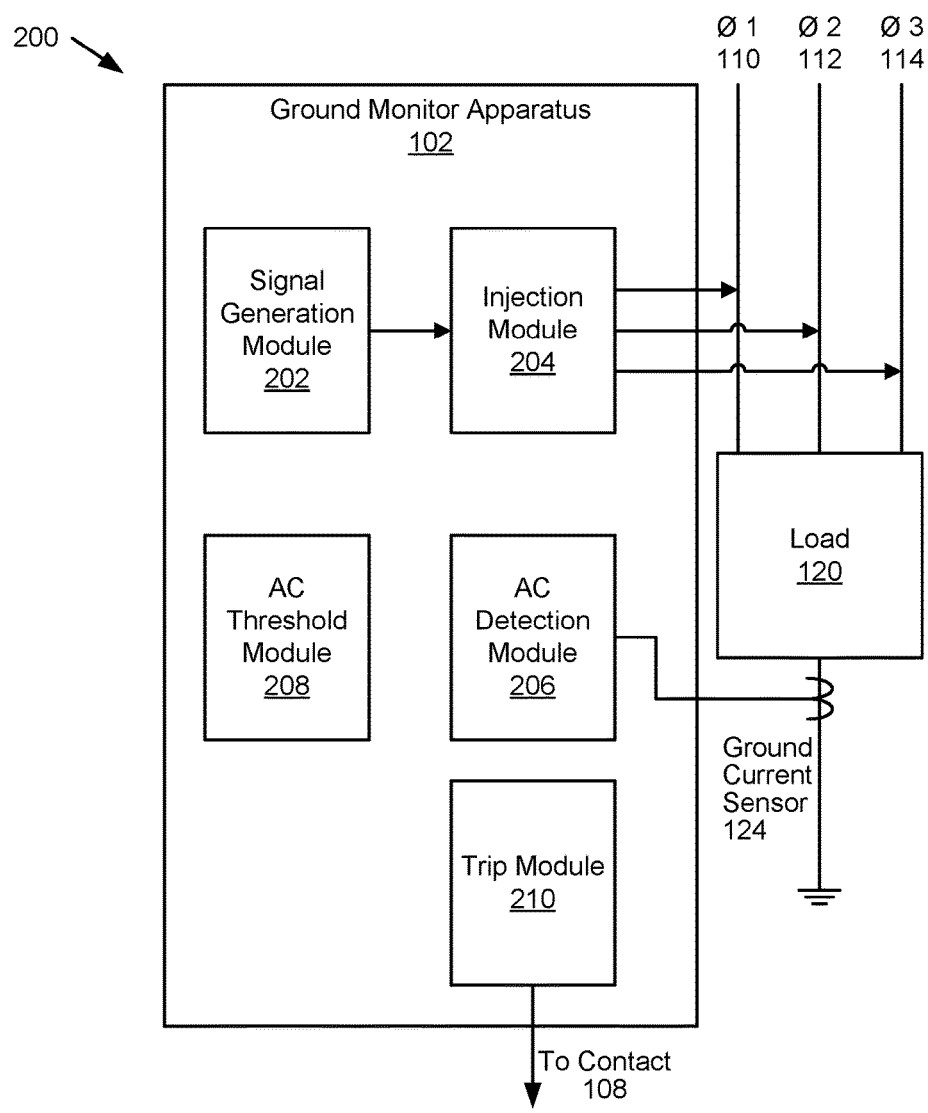
FIG. 2 is schematic block diagram depicting one embodiment of an apparatus for monitoring ground current.
Figure 3:
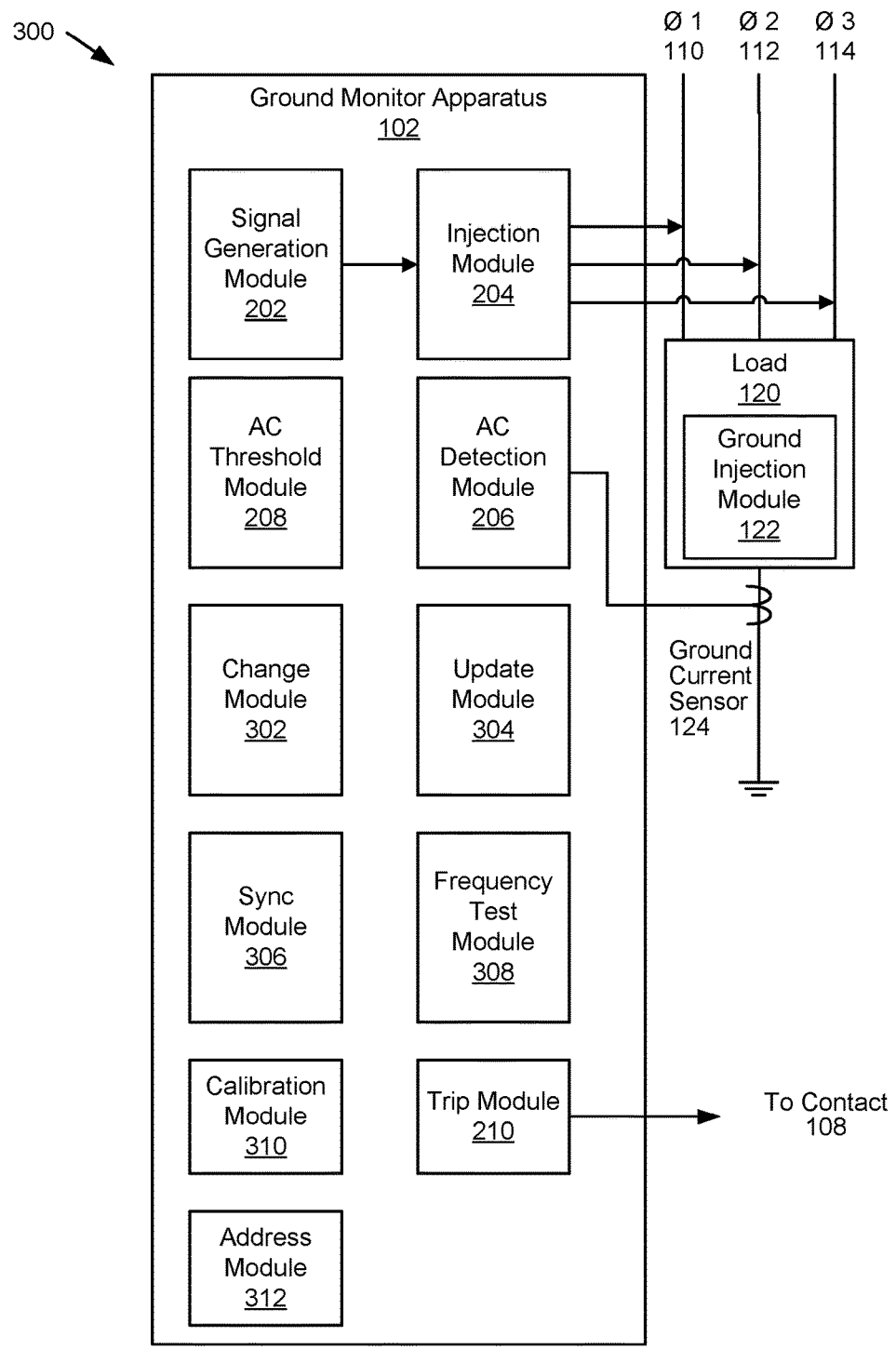
FIG. 3 is schematic block diagram depicting another embodiment of an apparatus for monitoring ground current.
Figure 4:
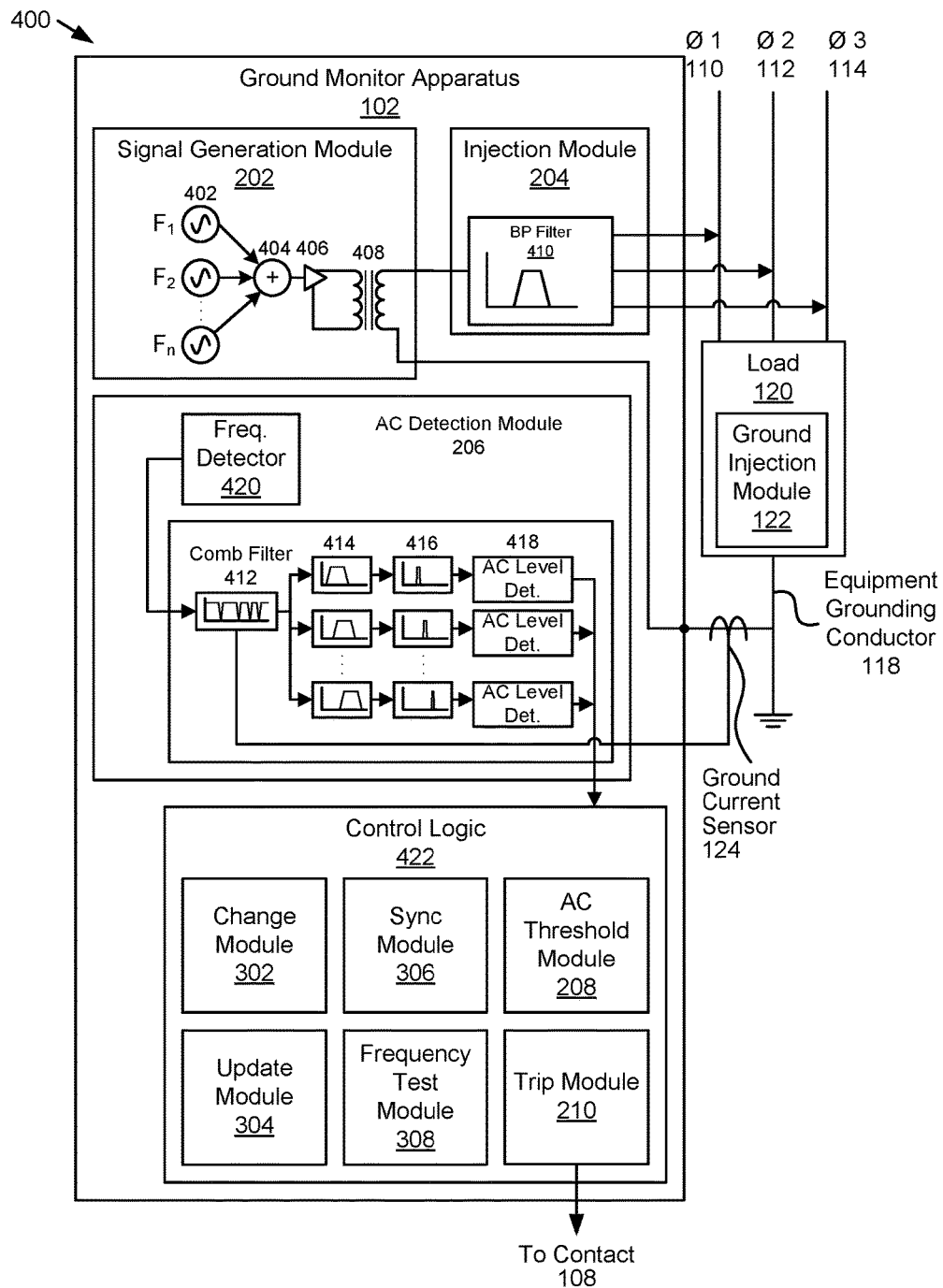
FIG. 4 is schematic block diagram depicting a more detailed embodiment of an apparatus for monitoring ground current.

The system 100 includes, in one embodiment, a ground monitor apparatus 102 that monitors current in the equipment grounding conductor 118, and is described in more detail with regard to the apparatuses 200, 300, 400 of FIGS. 2-4. The power source 104, in one embodiment, includes a three-phase power source 106. In one example, the three-phase power source 106 is a wye-connected source. The three-phase power source 106, in one example, is grounded through a neutral grounding resistor 116. In another embodiment, the three-phase power source 106 may be a delta-connected power source. In another embodiment, the power source 104 includes another type of power source, such as a single-phase power source or a direct current ("DC") power source. The three-phase power source 106 may include some type of a transformer or generator, or maybe wired to another source (not shown), such as a utility power system, a solar power system, a fuel cell, etc. In another embodiment, the power source 104 may include multiple power sources. In a particular embodiment, the power source 104 may be configured for an application in a mine. The power source 104, in one embodiment, is configured for mining applications and in another embodiment is configured to meet requirements of the Mine Safety and Health Administration ("MSHA"). One of skill in the art will recognize other power sources 104 that may include a ground monitor apparatus 102.

In one embodiment, the power source 104 includes a relay 108. As used herein, contact and relay are used interchangeably. The relay 108 may include a contact that may be normally open or normally closed and closing or opening the contact typically opens the relay 108. In one example, the relay 108 is a three-phase contactor. In another example, the relay 108 is a circuit breaker with a remote trip function. The relay 108 includes a capability to be commanded open by the ground monitor apparatus 102. The relay 108 may include a fault detection module (not shown) that sends a trip signal to the relay 108 on detection of an overcurrent condition. For example, a fault detection module may include current sensing and/or voltage sensing circuits may indicate an overcurrent or fault condition. The fault detection module may have an inverse time characteristic or other common protective relaying characteristic and may coordinate with other overcurrent protection devices upstream and downstream. The relay 108 may also be opened for other conditions, such as a manual command to open.

In one example, the relay 108 also includes the capability to be commanded open by the ground monitor apparatus 102. For example, the ground monitor apparatus 102 may send a command to open the relay 108 upon detection of a ground problem, such as a ground current different than expected. In another embodiment, or the power source 104 includes a different type of power source, such as a single phase source, the relay 108 may include a different number of poles. In another example, the relay 108 may be a three-pole contactor. One of skill in the art will recognize other types of relays 108 that may be used in conjunction with the power source 104 that includes a ground monitor apparatus 102.

In one embodiment, the system 100 includes a set of power cables wired to a load 120 with a first phase 110, a second phase 112, a third phase 114, and an equipment grounding conductor 118. In other embodiments, the set of power cables may include a neutral conductor (grounded conductor—not shown) wired to the load. For safety, it is desirable to determine if the equipment grounding conductor 118 is properly connected between the power source 104 and the load 120. For example, if the equipment grounding conductor 118 is disconnected, has failed, or in some way is not properly connected between the power source 104 and the load 120, there may be a hidden danger within the system 100. For instance, if a short circuit occurs and the equipment grounding conductor 118 is not properly connected, current may flow through the ground from the load 120 to the power source 104 and may generate an electric field within the ground that may cause an electrical hazard for personnel. In one embodiment, the ground monitor apparatus 102 helps to ensure that the equipment grounding conductor 118 is properly connected and functioning.

In one embodiment, the ground monitor apparatus 102 injects a signal into the phase conductors 110, 112, 114 of the power cable assembly and the ground injection module 122 injects the signal in the equipment grounding conductor 118 to sense an undesirable condition, such as a high impedance within the equipment grounding conductor 118, or other failure in the equipment grounding conductor 118 or in the ground monitor apparatus 102 and associated components. In one embodiment, a ground current sensor 124 senses current in the equipment grounding conductor 118. In one example, the ground current sensor 124 includes a current transformer that senses current in the equipment grounding conductor 118. The ground current sensor 124 is discussed in further detail with regard to the apparatuses 200, 300, 400 of FIGS. 2-4.

In another embodiment, the power source 104 includes a ground wire device ("GWD")(not shown). In one example, the GWD includes back-to-back diodes and the equipment grounding conductor 118 is connected to back to back diodes, and the back-to-back diodes are also connected to the chassis ground of the power source 104. The back-to-back diodes, in some embodiments, provide some signal isolation for monitoring injected signal in the equipment grounding conductor 118. In addition, the back-to-back diodes in the GWD help to keep any voltage on the equipment grounding conductor 118 to within a diode drop of the chassis ground. In another embodiment, a saturable coil may replace the back-to-back diodes.

The saturable coil, in one embodiment, may help keep voltage on the equipment grounding conductor 118 within a saturation voltage of the chassis ground. In another embodiment, the system 100 does not include a GWD but the equipment grounding conductor 118 is connected to chassis ground of the power source 104. One skilled in the art will recognize that various other methods exist that can help limit the voltage potential between the equipment grounding conductor 118 and the chassis ground, while providing some signal isolation for monitoring injected signal in the equipment grounding conductor 118. In one embodiment, the system 100 includes a watchdog apparatus (not shown) in the ground monitor apparatus 102. The watchdog apparatus, in one embodiment, determines if the ground monitor apparatus 102 is functioning properly.

FIG. 2 is schematic block diagram depicting one embodiment of an apparatus 200 for monitoring ground current. The apparatus 200 includes one embodiment of a ground monitor apparatus 102 with a signal generation module 202, an injection module 204, an AC detection module 206, an AC threshold module 208, a trip module 210, which are described below, along with a first phase 110, a second phase 112, a third phase 114, a load 120 and a ground current sensor 124, as described above with regard to the system 100 of FIG. 1.

The apparatus 200, in one embodiment, includes a signal generation module 202 that generates a plurality of alternating current ("AC") components. Each of the plurality of AC components has a different frequency. In one embodiment, each AC component is primarily a sinusoidal waveform where harmonics of the fundamental sinusoidal waveform are negligible. In other embodiments, each AC component includes a waveform that approximates a sinusoidal waveform, but is not purely sinusoidal and includes other harmonics that are significant. In one embodiment, each AC component includes a sinusoidal current waveform.

In one example, each AC component has a frequency different that a fundamental frequency of power transmitted by the power source 104. For example, the fundamental frequency of the power transmitted by the power source 104 may be 60 hertz ("Hz") for a typical power system found in the United States and other countries or 50 Hz as found in Europe or other countries. Each AC component, in one embodiment, differs from the fundamental frequency of the power source 104 and may also differ from harmonics of the fundamental frequency of the power source 104. Having AC components each with a frequency that differs from the frequency of the power source 104 and harmonics helps to ensure that a sensed AC component is intentionally injected and is not merely from the power source 104.

In one embodiment, each AC component is a current signal to be injected in the power cable assembly. In another embodiment, each AC component is a voltage signal. The amplitude of each AC component, in one embodiment, is high enough to distinguish the AC components from noise that may be present in the system 100 and low enough to meet safety standards and to not interfere with power generated by the power source 104.

The plurality of AC components includes at least two AC components, but may include three, four or more AC components. More than one AC components help to increase confidence that any AC components present on the equipment grounding conductor 118 are intentionally injected and that lack of one or more of the AC components on the equipment grounding conductor 118 at a high enough amplitude indicates that there is a problem with the equipment grounding conductor 118.

In one embodiment, each AC component has a frequency that is close enough to other AC components that all of the AC components generated by the signal generation module 202 may be passed through a single band pass filter. In another embodiment, the frequency of each AC component are separated enough such that multiple band pass filters are used when filtering the AC components.

The apparatus 200, in one embodiment, includes an injection module 204 that that injects the plurality of AC components on one or more phases 110, 112, 114 of the set of power cables connecting the power source 104 to a load 120. The set of power cables includes the equipment grounding conductor 118 and the AC components are injected in the equipment grounding conductor 118, typically at a location downstream of the power source 104, such as at the load 120. Injecting the AC components recovered from the phase conductors 110, 112, 114 at the load 120 or other location remote from the power source 104 is beneficial to help verify integrity of the equipment grounding conductor 118. In a typical embodiment, the set of power cables feeds a single load 120 the AC components recovered from the phase conductors 110, 112, 114 are injected at the load 120.

In other examples, where multiple loads 120 are fed by the set of power cables, injecting the AC components at a load 120 that is most remote from the power source 104 may help to verify integrity of the equipment grounding conductor 118 for each load 120 if the loads 120 in certain configurations, such as the loads 120 are daisy chained together. Other arrangements of loads 120 may be configured so that injection of the AC components recovered from the phase conductors 110, 112, 114 may leave gaps in determining integrity of the equipment grounding conductor 118. One of skill in the art will recognize various configurations of multiple loads 120 where determining integrity of the equipment grounding conductor 118 may be compromised.

In one embodiment, the injection module 204 is in electrical communication with the signal generation module 202 to receive the AC components generated by the signal generation module 202, and may also be located in the ground monitor apparatus 102. The injection module 204, in one embodiment, is in electrical communication with one or more of the phase conductors 110, 112, 114 in or near the power source 104. In one embodiment, the injection module 204 injects each AC component on each phase conductor 110, 112, 114. In another embodiment, the signal generation module 202 generates three AC components and the injection module 204 injects one AC component on each phase conductor 110, 112, 114 while isolating the other circuitry of the ground monitor apparatus 102 from the high voltages likely to be present on the phase conductors 110, 112, and 114. In one example, the injection module 204 injects the AC components on a single phase conductor (e.g. the first phase 110). In another example, the power source 104 is single phase and the injection module 204 injects the AC components in one or two phase conductors (e.g. 110 and/or 112). Injection of the AC components on multiple phase conductors may increase reliability or may help to ensure that a single break or problem with injecting the AC components doesn't prevent determining integrity of the equipment grounding conductor 118.

The apparatus 200, in one embodiment, includes an AC detection module 206 that determines an AC current corresponding to each frequency of the one or more AC components present in current in the equipment grounding conductor 118. For example, the AC detection module 206 may receive a signal from the ground current sensor 124, which is detecting current in the equipment grounding conductor 118 and may use the signal from the ground current sensor 124 to detect presence or absence of AC current of each AC component. For example, the AC detection module 206 may detect that AC current is not present or that AC currents that correspond to one or more AC components are not present in the equipment grounding conductor 118.

In one embodiment, the ground current sensor 124 includes a current transformer, resistor, hall-effect sensor or other current sensing device to detect AC current in the equipment grounding conductor 118. In one embodiment, the ground current sensor 124 produces a voltage signal proportional to current in the equipment grounding conductor 118. The AC detection module 206 may then use the voltage signal from the ground current sensor 124 to detect AC current of each AC component. In one embodiment, the AC detection module 206 includes the ground current sensor 124 and may be embodied by the ground current sensor 124.

In other embodiments, the AC detection module 206 includes additional components, such as amplifiers, signal conditioners, etc. For example, the AC detection module 206 may include one or more filters that filter out frequencies other than the frequencies of the AC components. In one embodiment, the AC detection module 206 isolates each AC component frequency and determines an amplitude of each AC component. In one embodiment, the AC detection module 206 converts an AC signal of an AC component to a direct current ("DC") voltage representative of the amplitude of the AC current of the AC component. For example, the AC detection module 206 may rectify and filter an AC signal corresponding to an AC component to produce a DC signal representative of the AC component. In another embodiment, the AC detection module 206 determines a root-mean-square ("RMS") voltage or peak voltage of an AC signal corresponding to an AC component. In another embodiment, the AC detection module 206 may be implemented using digital signal techniques, such as Analog-Digital conversion, digital filtering, etc., with a digital signal being produced which represents the amplitude of the AC current of the AC component.

The apparatus 200, in one embodiment, includes an AC threshold module 208 that determines if one or more of the AC currents determined by the AC detection module 206 is below an AC threshold. For example, the AC threshold module 208 may include a solid-state comparator or a comparison performed via digital signal processing software for each AC component and may determine if AC current with a frequency of an AC component has an amplitude that is above or below an AC threshold. In one embodiment, the AC threshold module 208 uses a same AC threshold for each AC component. In another embodiment, the AC threshold module 208 uses a different AC threshold for one or more of the AC components. The AC threshold module 208, in one embodiment, receives a signal from the AC detection module 206 representative of an AC current that corresponds to an AC component and compares the signal with an AC threshold.

The apparatus 200, in one embodiment, includes a trip module 210 that opens a contact 108 in response to the AC threshold module 208 determining that at least one of the AC currents is below an AC threshold. The contact 108 disconnects the power source 104 from the set of power cables. For example, the trip module 210 may open the relay 108 in the power source 104. In another embodiment, the trip module 210 opens a contact 108 that is external to the power source 104. For instance, the power source 104 may include a three-phase source 106 and the relay 108 may be external to the power source 104. In various embodiments, the trip module 210 includes trip logic that uses additional conditions in addition to the AC threshold module 208 determining that at least one of the AC currents is below an AC threshold. For example, the trip module 210 may open the contact 108 after an AC current of an AC component is below an AC threshold for more than a delay period. Other conditions may also be used, such as whether or not multiple AC currents corresponding to AC components are present, amount of time below a threshold, signal strength, and the like. Other conditions are discussed below.

FIG. 3 is schematic block diagram depicting another embodiment of an apparatus 300 for monitoring ground current. The apparatus 300 includes another embodiment of a ground monitor apparatus 102 with a signal generation module 202, an injection module 204, an AC detection module 206, an AC threshold module 208, a trip module 210, which are substantially similar to those described above in relation to the apparatus 200 of FIG. 2, along with a first phase 110, a second phase 112, a third phase 114, a load 120 and a ground current sensor 124, as described above with regard to the system 100 of FIG. 1. In various embodiments, the apparatus 300 includes a change module 302, an update module 304, a sync module 306, a frequency test module 308, a calibration module 310, an address module 312 and an embodiment of a ground injection module 122, which are described below.

The apparatus 300, in one embodiment, includes a change module 302 that periodically changes an AC component characteristic of one or more of the plurality of AC components and an update module 304 that changes an AC component characteristic sensed for one or more of the plurality of AC components to match the changed AC component characteristics of the AC components changed by change module 302 in response to the change module 302 changing the AC component characteristic of one or more of the plurality of AC components. In one embodiment, the change module 302 changes an AC component characteristic by changing frequency of an AC component. In the embodiment, the update module 304 changes the AC component characteristic sensed for one or more of the plurality of AC components by changing a sensed frequency to match the frequencies of the plurality of AC components changed by the change module 302. For example, if an AC component has a frequency of 800 Hz, the change module 302 may change the frequency of the AC component to 900 Hz. The update module 304 may then change a sensed frequency in the AC detection module 206 for the AC component to 900 Hz. The change module 302, for example, may use a frequency hopping spread spectrum technique.

In another embodiment, the change module 302 changes an AC component characteristic of one or more AC components by changing a phase of one or more AC components and the update module 304 changes the AC component characteristic sensed for one or more of the plurality of the AC components by changing a sensed phase to match the phases of the plurality of AC components changed by the change module 302. For example, an initial phase of an AC component may be zero degrees and the change module 302 may change the AC component to have a phase delay of 45 degrees. The update module 304 may then change sensing for the AC component to sense a phase delay of 45 degrees.

In one embodiment, the change module 302 changes the AC component characteristic after a time delay. For example, the time delay may be such that the AC component characteristic changes multiple times per second. In one embodiment, the change module 302 may change an AC component characteristic a minimum of 75 times in a 30 second period. In one embodiment, the change module 302 changes an AC component characteristic of one AC component at a time. In another embodiment, the change module 302 changes an AC component characteristic for all AC components at a same time. Typically, the update module 304 changes sensing for an AC component when the change module 302 changes the AC component characteristic for the AC component.

The apparatus 300, in one embodiment, includes a sync module 306 that synchronizes changes in sensing by the update module 304 with changes to the AC component characteristics of the plurality of AC components by the change module 302. For example, the sync module 306 may include communication between the change module 302 and the update module 304 so that changes to frequencies initiated by the change module 302 are communicated to the update module 304. In one embodiment, the signal generation module 202, the AC detection module 206, the change module 302, the update module 304 and the sync module 306 are located together in a single electronic device, such as a chip, a controller, a PC board, etc. so that the sync module 306 is implemented internal to the electronic device. In another embodiment, the sync module 306 uses a communication pathway, such as one or more signal traces, a network connection, a wireless connection, etc.

Abruptly changing the frequency of one or more AC components may result in a transient. The apparatus 300 may include one or more methods of reducing transients caused by the change module 302 changing frequencies or mitigating the effects of the transient. For example, the change module 302 may change the fundamental frequency of each of the one or more AC components by ramping from a current frequency to a new frequency over a period of time. For example, if a current frequency of an AC component is 990 Hz and the change module 302 changes to 950 Hz, the change module 302 may ramp the frequency of the AC component from 990 to 950 Hz through intermediate frequencies. In another embodiment where the change module 302 changes phase of each AC component, the change module 302 may ramp from a current phase to a new phase over a period of time, for example by changing phase over a range through intermediate phases.

In one embodiment, the change module 302 changes the AC component characteristic of each of the one or more AC components randomly. For example, the change module 302 may include a random number generator that generates a random number within a range and the change module 302 calculates a corresponding new frequency within a range of frequencies available for an AC component. The change module 302 may use the same technique to change each AC component simultaneously or separately. In one embodiment, the change module 302 includes at least one oscillator for each AC component. Each oscillator is capable of being adjusted to output various frequencies. For example, the oscillator may be an unstable oscillator that is controlled to generate a particular frequency. In one embodiment, an oscillator is set to a frequency using a coefficient and the change module 302 generates a random frequency for each of the one or more an AC components and calculates coefficients for an oscillator corresponding to each AC component to generate the random frequency for each of the one or more AC components. The update module 304 then calculates coefficients for one or more filters to match the random frequency for each of the one or more AC components. One of skill in the art will recognize other ways to generate a random frequency for each AC component.

In another embodiment, the change module 302 includes a first and a second frequency generator, such as an oscillator, for each of the one or more AC components and changes, for an AC component, from a current frequency generated by the first frequency generator to a new frequency generated by the second frequency generator. Each first frequency generator fades out the current frequency and each second frequency generator fades in the new frequency. Inclusion of multiple frequency generators for a particular AC component adds cost, but may minimize transients during a frequency change.

In another embodiment, the AC detection module 206 deactivates detecting the AC current of the one or more AC components during a time period when the change module 302 changes the AC component characteristic by changing the fundamental frequency and/or phase of each of the one or more AC components. The time period of deactivation of detection may correspond to a transient period after a frequency change. Where an abrupt frequency change causes a transient that is unacceptable, due to length of time to settle or other negative characteristic, the change module 302 may employ one or more of the techniques described above to ramp changes to minimize transients and negative effects resulting therefrom. In one embodiment, the period of time between when the change module 302 changes frequency is affected by transients, ramping, etc. and is typically a factor in determining a minimum time between frequency changes.

In one embodiment, the apparatus 300 includes a frequency test module 308 that determines if a frequency is present on the equipment grounding conductor 118 prior to selecting the frequency for an AC component. For example, the frequency test module 308 may select a candidate frequency and may detect if the candidate frequency is present on the equipment grounding conductor 118. The frequency test module 308 may include a comb filter, a band pass filter, a parametric filter, etc. to isolate the candidate frequency from other frequencies present on the equipment grounding conductor 118. The frequency test module 308 may include an AC threshold and may determine if an amplitude of the candidate frequency is above the AC threshold.

If the frequency test module 308 determines that the candidate frequency is below the AC threshold, the frequency test module 308 may mark the candidate frequency as available for use by the change module 302 and the update module 304 or otherwise make the candidate frequency available for use. For example, the frequency test module 308 may store the candidate frequency in a table or other data structure that is accessible by the change module 302 and update module 304. In another example, the frequency test module 308 may pass the candidate frequency to the change module 302 and/or update module 304 for use. In one embodiment, the frequency test module 308 tests numerous candidate frequencies for use by the change module 302 and update module 304 at a present time or a later time. In another embodiment, the frequency test module 308 tests a candidate frequency just before use by the change module 302 and update module 304.

A candidate frequency may not be present on the equipment grounding conductor 118 at one point in time but may be present at a later time. Thus, the frequency test module 308 may associate a testing time with a candidate frequency when the frequency test module 308 tested to determine if the candidate frequency was present on the equipment grounding conductor at that testing time. The change module 302 may use the candidate frequency for some period of time (i.e. a "valid time") after the testing time and may avoid the candidate frequency after the valid time until the frequency test module 308 tests the candidate frequency again. One of skill in the art will recognize other ways for the frequency test module 308 to test candidate frequencies that may be available to the change module 302 and the update module 304 for use.

In one embodiment, the apparatus 300 includes a calibration module 310 that determines a baseline amplitude for each of the plurality of AC components and sets, for each AC component, an AC threshold based on the determined baseline amplitude of the AC component. For example, the calibration module 310 may utilize measurements from the AC detection module 206 to establish a baseline amplitude for each AC component. The calibration module 310 may then set an AC threshold for each AC component that is related to the measured amplitude for an AC component. For example, if the AC determination module 206 determines that an AC amplitude is 10 volts ("V"), the calibration module 310 may set the baseline amplitude to be 10 V and may set an AC threshold for the AC component to be 6 V. The calibration module 310 may use RMS voltages, peak voltages, a digital representation of an AC voltage or current, or other convenient measurement. The calibration module 310 is useful to base the AC thresholds on a measured voltage instead of an expected voltage. Using an actual measurement allows for variations in measured voltages due to differences between systems where the ground monitor apparatus 102 installed. In one embodiment, the calibration module 310 operates in response to a command, such as pressing a button or receiving a signal.

In one embodiment, the calibration module 310 works in conjunction with the frequency test module 308 where the frequency test module 308 finds candidate frequencies and the calibration module 310 determines an amplitude of chosen frequencies injected by the injection module 204 and adjusts the AC thresholds based on measured amplitudes of the AC components. In another embodiment, the frequency test module 308 determines a list of candidate frequencies at a time of calibration. The change module 302 may use the candidate frequencies over time. In another embodiment, the frequency test module 308 determines candidate frequencies initially and in future operations before a change in frequency by the change module 302. The calibration module 310 may operate for chosen candidate frequencies just before a frequency change by the change module 302 to determine appropriate AC thresholds. In another embodiment, the frequency test module 308 determines a list of candidate frequencies and the calibration module 310 measures an amplitude of each AC component just prior to final adoption of the candidate frequencies by the change module 302 or just after the change module 302 changes frequencies.

In another embodiment, the frequency test module 308 and the calibration module 310 find enough candidate frequencies and corresponding baseline amplitudes and associated AC thresholds to determine a frequency response of the ground monitor apparatus 102. The frequency response information, in one embodiment, is used to determine baseline amplitudes for new candidate frequencies without recalibration. The frequency test module 308 may then at a later time check a new candidate frequency to verify that the candidate frequency is available for use by the change module 302 and the frequency response may then be used by the calibration module 310 to calculate a baseline amplitude without a formal recalibration. The calibration module 310 may then use the calculated baseline amplitudes to determine appropriate AC thresholds for the AC components.

In one embodiment, the apparatus 300 includes an address module 312 that limits the ground monitor apparatus 102 to a particular frequency range in response to determining an address assigned to the ground frequency monitor 102. The frequency range includes frequencies used by the signal generation module 202 and change module 302 for AC components. In one embodiment, the frequency range includes a range of frequencies between a lower frequency limit and an upper frequency limit where frequencies between the lower and upper frequency limits may be used for AC components. In another embodiment, the frequency range includes a list of discrete frequencies that may be use for AC components. In another embodiment, the frequency range includes multiple ranges of frequencies.

In one embodiment, an address may be assigned to a ground monitor apparatus 102. For example, a user may establish an address for the ground monitor apparatus 102 by setting dip switches on the ground monitor apparatus 102 where a combination of dip switch settings establishes the address for the ground monitor apparatus 102. In another embodiment, an address is assigned to the ground monitor apparatus 102 by sending a signal over a communication network connected to the ground monitor apparatus 102.

In one embodiment, each ground monitor apparatus 102 in a system is assigned a different address where each address corresponds to a different frequency range so that multiple ground monitor apparatuses 102 connected to a power system will use different frequencies for AC components. Having each ground monitor 102 use different frequencies for AC components is beneficial to help prevent interference between ground monitor apparatuses 102. In another embodiment, having ground monitor apparatuses 102 with a frequency test module 308 and a calibrate module 310 allows for testing of candidate frequencies to reduce chances of interference with an AC component of another ground monitor apparatus 102 and for calibration to establish baseline amplitudes and corresponding AC thresholds above noise that may be caused by another ground monitor apparatus 102. One of skill in the art will recognize how to use a frequency test module 308 and a calibration module 310 or to use an address module 312 to avoid interference with other ground monitor apparatuses 102.

FIG. 4 is schematic block diagram depicting a more detailed embodiment of an apparatus 400 for monitoring ground current. The apparatus 400 includes another embodiment of the ground monitor apparatus 102 with a signal generation module 202, an injection module 204, an AC detection module 206, an AC threshold module 208, a trip module 210, a change module 302, an update module 304, a sync module 306 and a frequency test module 308, which are substantially similar to those described above in relation to the apparatuses 200, 300 of FIGS. 2 and 3, along with a first phase 110, a second phase 112, a third phase 114, a load 120 and a ground current sensor 124, as described above with regard to the system 100 of FIG. 1. In various embodiments, the apparatus 400 includes a signal generation module 202 with oscillators 402, a summing device 404, an amplifier/buffer 406, and a transformer 408, an injection module 204 with a band pass filter 410, an AC detection module with a comb filter 412, band pass filters 414, parametric filters 416, AC level detectors 418, a frequency detector 420, and a controller 422, which may include the AC threshold module 208, the trip module 210, the change module 302, the update module 304, the sync module 306, and the frequency test module 308, which are described below.

The apparatus 400, in one embodiment, includes a signal generation module 202 that includes an oscillator 402 for each AC component, where each oscillator 402 generates a signal with a specific frequency. Each oscillator 402, in one embodiment, has a different frequency than other oscillators 402. As described above, each oscillator may be an unstable oscillator with a coefficient input that sets a frequency of the oscillator 402. The change module 302 may input a coefficient for each change in frequency. In another embodiment, the change module 302 changes a phase of an oscillator 402.

In one embodiment, each oscillator 402 in the signal generation module 202 is summed with a summing device 404. The summing device may simply connect the outputs of the oscillators 402, or may include a specific device that combines the outputs of the oscillators 402 into one signal that includes each AC component. In one embodiment, the signal generation module 202 may include an amplifier and/or buffer that may amplify the AC components or may buffer the AC components or otherwise condition the AC component signals. Optionally, the signal generation module 202 includes a transformer that may be used to isolate the oscillators, the summing device 404, etc. from the injection module 204 and/or phase conductors 110, 112, 114. The transformer may or may not be required, depending on various conditions, such as how much electrical isolation is required to provide adequate protection for the circuitry comprising the signal generation module 202.

The injection module 204, in one embodiment, includes a connection to one or more of the phase conductors 110, 112, 114 of the set of power conductors. The connection to the phase conductors 110, 112, 114 facilitate injection of the AC components on the phase conductors 110, 112, 114 and isolates the ground monitor apparatus 102 from high voltages on the phase conductors 110, 112, and 114.

The injection module 204, in one embodiment, includes one more band pass filters 410 that pass the AC components to the phase conductors 110, 112, 114. The band pass filter 410, in one embodiment passes the AC components, which have frequencies that are close enough together to be passed by the band pass filter 410. In another embodiment, the injection module 204 includes more than one band pass filter 410. For example, the ground injection module 122 may include a band pass filter 410 for each AC component. In one embodiment, a band pass filter 410 may include an inductor in series with the output signal of the signal generation module 202 and a capacitor in series with each phase conductor 110, 112, 114 with a connection point between the inductor and capacitors, which may form the band pass filter. The inductor and capacitors may be sized to pass one or more of the AC components. In other embodiments, more complex band pass filters 410 may be used. The band pass filter 410 in the injection module 204 may pass the AC components while blocking other frequencies, such as the frequency of the power transmitted by the power source 104 or harmonics of the frequency of the power transmitted by the power source 104. One of skill in the art will recognize other embodiments of a band pass filter 410 that may pass the AC components while blocking other frequencies.

In one embodiment, the apparatus 400 includes a ground injection module 122 that filters the AC components present in the one or more phases 110, 112, 114 of the set of power cables and injects the AC components in the equipment grounding conductor 118. In another embodiment, the ground injection module 122 is located in the load 120. Placement of the ground injection module 122 in the load 120 may be beneficial so that the entire equipment grounding conductor 118 from the power source 104 to the load 120 is engaged for detection of ground integrity problems. In one embodiment, the ground injection module 122 connects to each phase 110, 112, 114 with AC components. For example, if the injection module 204 injects the AC components on all phase conductors 110, 112, 114, the ground injection module 122 may have a connection to each phase conductor 110, 112, 114 so that if for some reason a phase conductor (e.g. 110) has a problem that affects AC components riding on the phase conductor 110, the other phase conductors (e.g. 112, 114) may be used to extract the AC components. In other embodiments, the ground injection module 122 may include a connection to a subset of the phase conductors 110, 112, 114.

In one embodiment, the ground injection module 122 includes one or more band pass filters that pass the AC components and filter out other components. In one example, the ground injection module 122 includes a single band pass filter that passes all AC components. In other situations, for example where the AC components are spread further apart, the ground injection module 122 may include multiple band pass filters, each tuned to one or more of the AC components. In one example, each connection to a phase conductor 110, 112, 114 in the ground injection module 122 includes a capacitor connected in series and a connection to the equipment grounding conductor 118 in the ground injection module 122 includes an inductor and the inductor is connected to the capacitors, thus forming a filter where the capacitors and inductor have values chosen to pass the AC components while excluding other frequencies, such as the frequency and harmonics of power transmitted by the power source 104. In other embodiments, multiple stage filters or other more complex filtering is used. In other embodiments, the ground injection module 122 includes active filtering to isolate the AC components for injection on the equipment grounding conductor 118. One of skill in the art will recognize other filters, circuits, etc. to include in the ground injection module 122 to sense the AC components riding on the phase conductors 110, 112, 114 and to inject the AC components on the equipment grounding conductor 118.

The AC detection module 206, in one embodiment, includes a fundamental frequency filter that filters out a fundamental frequency of power transmitted on the set of power cables. In one example, the fundamental frequency filter includes a comb filter 412 tuned to filter out the fundamental frequency and harmonic frequencies of the power transmitted on the set of power cables. The comb filter 412, in one embodiment receives an AC current from the equipment grounding conductor 118 and blocks the fundamental frequency of the power transmitted to the load by the power source 104 (i.e. "power frequency"), as well as other harmonics of the power frequency. The comb filter 412 may attenuate the power frequency and harmonics. The comb filter 412 helps to eliminate the power frequency and harmonics of the power frequency to avoid interference of detection of the AC components.

The AC detection module 206, in one embodiment, includes one or more filters for each AC component. The one or more filters of an AC component attenuate frequencies other than a frequency of the AC component. As depicted in FIG. 4, once attenuated by the comb filter 412, the signal splits into a series of filters and other elements so that each path is for an AC component. In one embodiment, each AC component includes a band pass filter 414 that passes AC current of the AC component. The band pass filter 414 is tuned to the AC component to pass the AC component while blocking other frequencies. In one embodiment, the band pass filter 414 for an AC component is followed by a parametric filter 416 that also passes the AC component. The parametric filter 418 for an AC component, in one embodiment, has a narrow pass band to further eliminate frequencies other than the AC component.

In one embodiment, the one or more filters for each AC component include digital signal processing ("DSP") filters. In one embodiment, the parametric filter 416 is a digital filter and allows change to the detected frequency. The parametric filter 416 may change which frequency is being detected to match a new frequency selected by the change module 302. The update module 304 may change a coefficient or other parameter in the parametric filter 416 of an AC component to change the detected frequency.

In one embodiment, the band pass filter 414 for an AC component has a pass band that passes a range of frequencies selected by the change module 302 for a particular AC component. In another embodiment, the band pass filter 414 for an AC component has a pass band that is adjustable and is set by the update module 304 along with the detected frequency of the parametric filter 416 for the AC component.

In one embodiment, the AC detection module 206 includes an AC level detector 418 for each AC component. For example, an AC level detector may include rectification of the signal passed from the parametric filter 416 of the AC component which converts the AC signal of the parametric filter 416 to a DC signal representative of an amplitude of AC current of the AC component. In another embodiment, the parametric filter 416 and/or AC level detector 418 digitize the AC current of an AC component and assign a digital value representative of the amplitude of the AC component.

In one embodiment, the AC detection module 206 includes a frequency detector 420 that detects the power frequency and adjusts the comb filter 412 based on the detected power frequency. For example, the power frequency may vary a bit over time or may vary for each installation of a ground monitor apparatus 102 so frequency detector 420 may be used to more accurately set frequencies in the comb filter 412 to attenuate.

In one embodiment, the apparatus 400 includes control logic 422 that receives outputs of the AC level detector 418 of each AC component and determines when to send a trip signal to the relay 108. The control logic 422, in one embodiment, includes the AC threshold module 208 that may include digital comparators to compare signals from the AC level detectors 418 to an AC threshold. The trip module 210 may use information from the AC threshold module 208 to determine when and if a trip signal is sent to the relay 108.

In addition, the control logic 422 may include other functions, such as the change module 302, the update module 304, the sync module 306, the frequency test module 308, etc. In other embodiments, these modules 302, 304, 306, 308 may be included in other locations. For example, the change module 302 may be located in the signal generation module 202, the update module 304 may be located in the AC detection module 206, the sync module 306 and/or frequency test module 308 may be located in the AC detection module 206 and/or the signal generation module 202.

The trip module 210, in one embodiment, includes various conditions and tests that must be analyzed prior to sending a trip signal. For example, where a single AC component is below an AC threshold while other AC components are above the AC threshold, this condition may be more indicative of a problem with sensing circuitry or other issue rather than a problem with the equipment grounding conductor 118. Thus, for the condition of a single AC component below an AC threshold, an alert may be sent, a trip latch may be set, etc. A trip latch may set a latch for a particular time period where at the end of the time period if conditions are the same as when the latch was set or there is some other condition indicative of a problem with the equipment grounding conductor 118, the latch may trigger the trip module 210 to send a trip signal.

In a situation where multiple AC components are below an AC threshold, the trip module 210 may send the trip signal or may take some action different than where a single AC component is below an AC threshold. In another situation where all AC components are below AC thresholds, the trip module 210 may immediately send a trip signal. In other embodiments, various conditions may set trip latches of various lengths of time. In other embodiments, the AC threshold module 208 includes multiple AC thresholds for an AC component. For example, one AC threshold may be a first trip condition and another lower AC threshold may be second trip condition. The first trip condition may be less severe so that more conditions are required, a longer time delay is required, etc. before the trip module 210 sends a trip signal. The second trip condition may require more immediate action or may require less conditions be met before the trip module 210 sends the trip signal. Injecting and sensing a plurality of AC components allows more flexibility than typical tone monitors that detect a single frequency. Using digital signal processing ("DSP") for filtering and sensing also allows more precision for detection of an AC component so that multiple AC components can be injected and accurately sensed.

In other embodiments, the control logic 422 includes other functions, such as a watchdog circuit. The watchdog circuit may be used to verify functionality of the control logic 422, may verify circuit integrity, may sense abnormal conditions, etc. and may send an alert or may direct the trip module 210 to send a trip signal. In addition, ground monitor apparatus 102 may sense other abnormal conditions, such as a ground fault. For example, a ground fault current detector may sense current in the neutral grounding resistor 116 and a ground fault module may direct the trip module 210 to send a trip signal where current in the neutral grounding resistor 116 is above a ground fault threshold. The control logic 422 may also include over current protection for the set of power conductors. The overcurrent protection may include various trip characteristics based on current in the phase conductors 110, 112, 114, such as inverse time characteristics, instantaneous trip characteristics, etc. The control logic 422 may include adjustments for coordination with other overcurrent protection or ground fault protection in downstream or upstream devices and power sources. In another embodiment, overcurrent, ground fault current, etc. may be external to the ground monitor apparatus 102.

Figure 5:
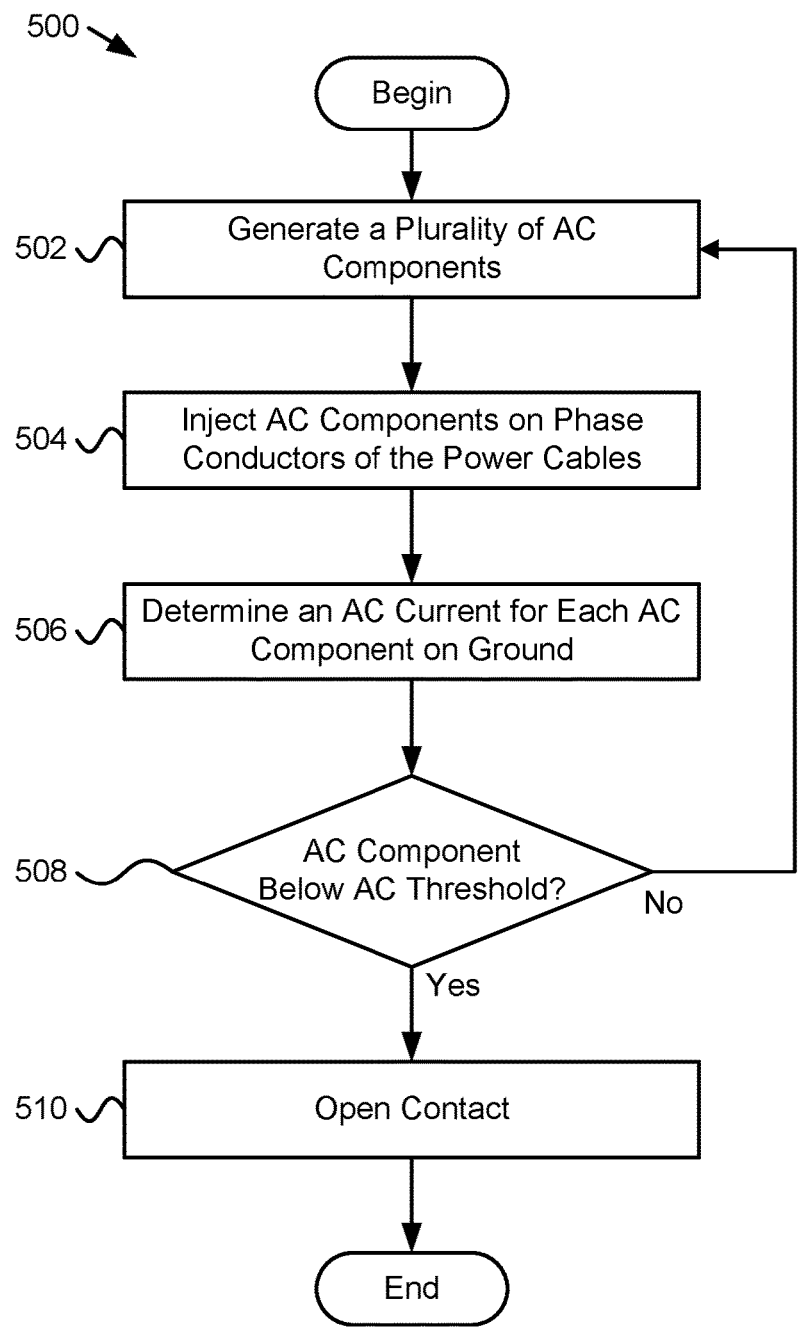
FIG. 5 is a schematic flowchart diagram illustrating one embodiment of a method for monitoring ground current.

FIG. 5 is a schematic flowchart diagram illustrating one embodiment of a method 500 for monitoring ground current. The method 500 begins and generates 502 a plurality of AC components. In one embodiment, each AC component has a different frequency. In one embodiment, the signal generation module 202 generates 502 the AC components. The AC components, in another embodiment, differ from the power frequency or harmonics of the power frequency.

The method 500 injects 504 the plurality of AC components on one or more phases 110, 112, 114 of a set of power cables connecting a power source 104 to a load 120. The set of power cables include an equipment grounding conductor 118, and the AC components are injected in the equipment grounding conductor 118. In one example, the injection module 204 injects 504 the AC components. The method 500 determines 506 an AC current for each AC component present in the equipment grounding conductor 118. For example, the method 500 may determine 506 the AC current from current sensed in the ground current sensor 124 and may use filters to exclude frequencies other than an AC component frequency. In one embodiment, the AC detection module 206 determines 506 the AC current.

The method 500 determines 508 if one or more of the determined AC currents is below an AC threshold. If method 500 determines 508 that one or more of the determined AC currents is not below an AC threshold, the method 500 returns and continues to generate 502 the plurality of AC components, injects 504 the AC components, etc. If the method 500 determines 508 that one or more of the determined AC currents is below an AC threshold, the method 500 opens 510 a contact 108 where the contact 108 disconnects the power source 104 from the set of power cables, and the method 500 ends. The trip module 210, in one embodiment, determines 508 if one or more of the determined AC currents is below an AC threshold and opens 510 the contact 108.

Figure 6:
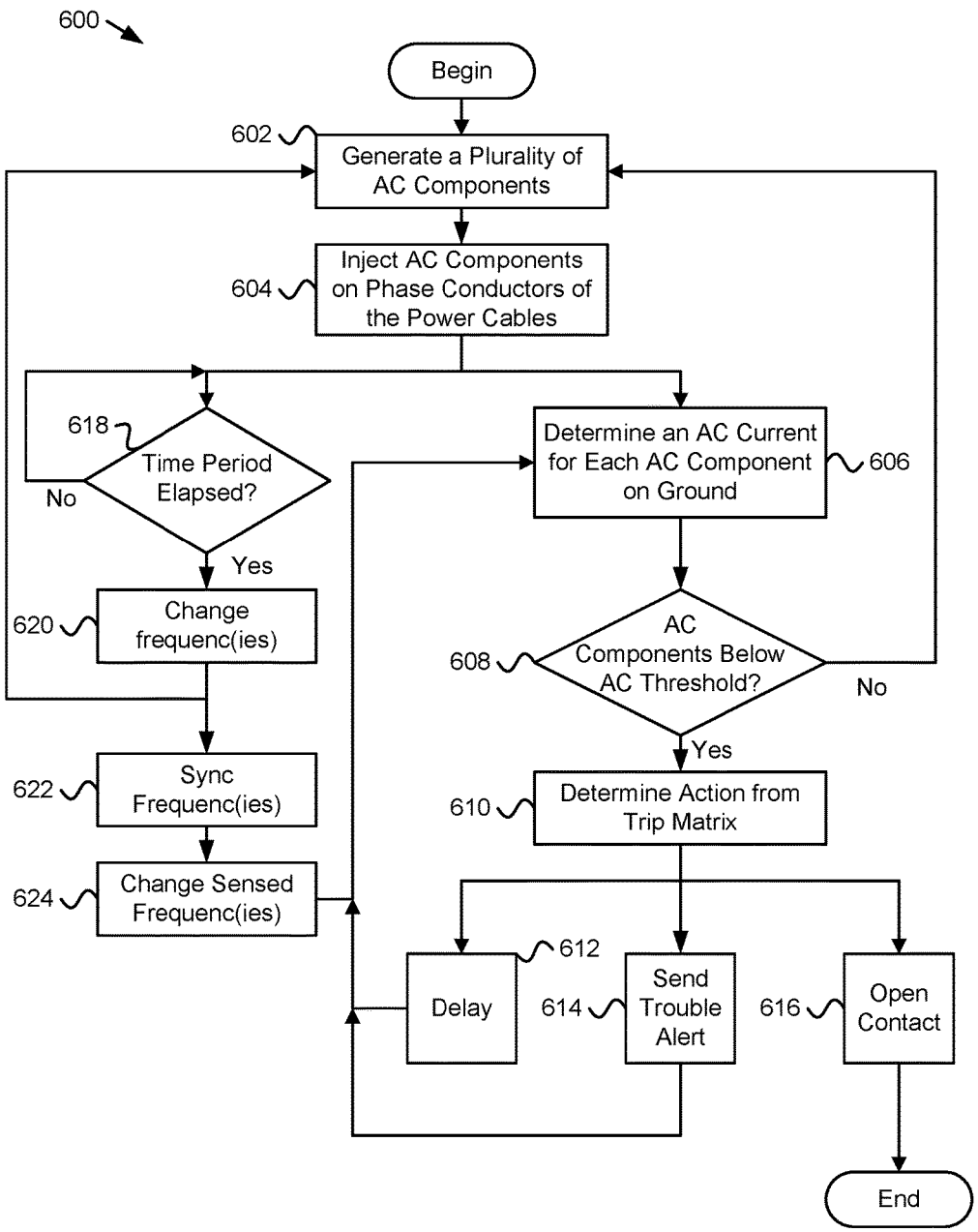
FIG. 6 is a schematic flowchart diagram illustrating another embodiment of a method for monitoring ground current.

FIG. 6 is a schematic flowchart diagram illustrating another embodiment of a method 600 for monitoring ground current. The method 600 begins and generates 602 a plurality of AC components where, in one embodiment, each AC component has a different frequency. The method 600 injects 604 the plurality of AC components on one or more phases 110, 112, 114 of a set of power cables connecting a power source 104 to a load 120. The set of power cables include an equipment grounding conductor 118, and the AC components are injected in the equipment grounding conductor 118. In one embodiment (not shown), the method 600 senses the AC components from the phase conductors 110, 112, 114 and injects the AC components on the equipment grounding conductor 118. The method 600 determines 606 an AC current for each AC component present in the equipment grounding conductor 118 and determines 608 if one or more of the determined AC currents is below an AC threshold. If method 600 determines 608 that one or more of the determined AC currents is not below an AC threshold, the method 600 returns and continues to generate 602 the plurality of AC components, injects 604 the AC components, etc.

If the method 600 determines 608 that one or more of the determined AC currents is below an AC threshold, the method 600 determines 610 an action to perform based on a trip matrix. The action may depend on a variety of conditions, such as how many AC components are below an AC threshold, how long an AC component is below an AC threshold, etc. For example, if the method 600 determines 610, from the trip matrix, that delaying opening the contact 108 is warranted, the method 600 may delay 612 action to open the contact 108. If the method 600 determines 610, from the trip matrix, that there is a problem with an AC component signal or some other trouble condition, the method 600 may send 614 an alert. For example, if one AC component is below an AC threshold while the other AC components are above AC thresholds, this condition may indicate a problem and the method 600 may send 614 a trouble alert.

If the method 600 determines 610, from the trip matrix, that a trip is warranted, the method 600 may open 616 the contact 108, and the method 600 ends. For example, the method 600 may determine 610 that one or more AC components have remained below one or more AC thresholds for a delay period and the method 600 may then open 600 the contact 108. In another embodiment, if the method 600, based on the trip matrix, determines 610 that all AC components are below AC thresholds for predetermined period of time, or possibly instantaneously, the method 600 may then open 616 the contact 108. One of skill in the art will recognize other conditions and actions for delaying 612 action, sending 614 an alert, opening 616 the contact 108, etc.

While the method 600 is determining 606 an AC current, determining 608 if an AC current of an AC component is below an AC threshold, etc., the method 600, in one embodiment according to a frequency hopping or other similar scheme, determines 618 if a time period has elapsed. If the method 600 determines 618 that the time period has not elapsed, the method 600 returns and continues to determine 618 if the time period has elapsed. If the method 600 determines 618 that the time period has elapsed, the method 600 changes 620 the frequency of one or more AC components and returns to generate 602 the plurality of AC components with the new frequenc(ies).

In addition, the method 600 synchronizes 622 frequencies with components determining 606 the AC current of each AC components and changes 624 sensed frequenc(ies) of the devices determining 606 the AC current of the AC components. The method 600 may synchronize 622 the frequencies of the generated 602 and determined 606 AC components by communicating the frequency changes to devices determining 606 the AC currents of the AC components. In one embodiment, the change module 302 changes 620 frequenc(ies) of the AC components, the sync module 306 synchronizes 622 the frequencies, and the update module 304 changes 624 the sensed frequencies of the AC detection module 206. In another embodiment (not shown), the method 600 may test one or more candidate frequencies to determine if the candidate frequenc(ies) are present in the equipment grounding conductor 118 before the method 600 uses the candidate frequencies for changing 620 frequencies of AC components.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus comprising:
    a signal generation module that generates a plurality of alternating current ("AC") components, each of the plurality of AC components comprising a different frequency;
    an injection module that injects the plurality of AC components on one or more phases of a set of power cables connecting a power source to a load, the set of power cables comprising an equipment grounding conductor, wherein the AC components present in the one or more phases at the load are injected in the equipment grounding conductor at the load;
    an AC detection module that determines an AC current corresponding to each frequency of the one or more AC components present in current in the equipment grounding conductor;
    an AC threshold module that determines if one or more of the AC currents determined by the AC detection module is below an AC threshold; and
    a trip module that opens a contact in response to the AC threshold module determining that at least one of the AC currents is below an AC threshold, the contact disconnecting the power source from the set of power cables.

2. The apparatus of claim 1, further comprising a ground injection module that filters the AC components present in the one or more phases of the set of power cables and injects the AC components in the equipment grounding conductor.

3. The apparatus of claim 2, wherein the ground injection module is located in the load.

4. The apparatus of claim 1, wherein the injection module comprises one or more band pass filters, each band pass filter of the one or more band pass filters tuned to pass one or more of the AC components.

5. The apparatus of claim 1, wherein a frequency of each of the AC components differs from a fundamental frequency of power transmitted on the set of power cables.

6. The apparatus of claim 1, wherein the AC detection module further comprises a fundamental frequency filter that filters out a fundamental frequency of power transmitted on the set of power cables.

7. The apparatus of claim 6, wherein the fundamental frequency filter comprises a comb filter tuned to filter out the fundamental frequency and harmonic frequencies of the power transmitted on the set of power cables.

8. The apparatus of claim 1, wherein the AC detection module further comprises one or more filters for each AC component, the one or more filters of an AC component attenuating frequencies other than a frequency of the AC component.

9. The apparatus of claim 8, wherein the one or more filters for each AC component comprise digital signal processing ("DSP") filters.

10. The apparatus of claim 8, wherein the one or more filters for each AC component comprise one or more of a band pass filter and a parametric filter.

11. The apparatus of claim 1, wherein the trip module compares each AC component to an AC threshold.

12. The apparatus of claim 1, further comprising:
    a change module that periodically changes an AC component characteristic of one or more of the plurality of AC components; and
    an update module that changes an AC component characteristic sensed for one or more of the plurality of AC components to match the changed AC component characteristics of the AC components changed by change module in response to the change module changing the AC component characteristic of one or more of the plurality of AC components.

13. The apparatus of claim 12, wherein the change module changes an AC component characteristic of one or more of the plurality of AC components by changing a frequency of one or more of the plurality of AC components and the update module changes the AC component characteristic sensed for one or more of the plurality of AC components by changing a sensed frequency to match the frequencies of the plurality of AC components changed by the change module.

14. The apparatus of claim 12, wherein the change module changes an AC component characteristic of one or more of the plurality of AC components by changing a phase of one or more of the plurality of AC components and the update module changes the AC component characteristic sensed for one or more of the plurality of the AC components by changing a sensed phase to match the phases of the plurality of AC components changed by the change module.

15. The apparatus of claim 12, further comprising a sync module that synchronizes changes in sensing by the update module with changes to the AC component characteristic of each of the plurality of AC components by the change module.

16. The apparatus of claim 12, wherein the change module changes the AC component characteristic of one or more of the plurality of AC components by one or more of:
    ramping from a current frequency to a new frequency over a period of time; and
    ramping from a current phase to a new phase over a period of time.

17. The apparatus of claim 12, wherein the change module changes the AC component characteristic of one or more of the plurality of AC components randomly.

18. The apparatus of claim 17, wherein the change module calculates coefficients for an oscillator corresponding to each AC component to generate the random frequency for each of the AC components changed by the change module and the AC detection module calculates coefficients for a filter to match the random frequency for each of the one or more AC components changed by the update module.

19. The apparatus of claim 12, further comprising a frequency test module that determines if a frequency is present on the equipment grounding conductor prior to selecting the frequency for an AC component.

20. The apparatus of claim 1, further comprising a calibration module that determines a baseline amplitude for each of the plurality of AC components and sets, for each AC component, an AC threshold based on the determined baseline amplitude of the AC component.

21. A system comprising:
- a power source; and
- a ground monitor in the power source, the ground monitor comprising
  - a signal generation module that generates a plurality of alternating current ("AC") components, each of the plurality of AC components comprising a different frequency;
  - an injection module that injects the plurality of AC components on one or more phases of a set of power cables connecting a power source to a load, the set of power cables comprising an equipment grounding conductor, wherein the AC components present in the one or more phases at the load are injected in the equipment grounding conductor at the load;
  - an AC detection module that determines an AC current corresponding to each frequency of the one or more AC components present in current in the equipment grounding conductor;
  - an AC threshold module that determines if one or more of the AC currents determined by the AC detection module is below an AC threshold; and
  - a trip module that opens a contact in response to the AC threshold module determining that at least one of the AC currents is below an AC threshold, the contact disconnecting the power source from the set of power cables.

22. The system of claim 21, further comprising a ground injection module that filters the AC components present in the one or more phases of the set of power cables and injects the AC components in the equipment grounding conductor.

23. A method comprising:
- generating a plurality of alternating current ("AC") components, each of the plurality of AC components comprising a different frequency;
- injecting the plurality of AC components on one or more phases of a set of power cables connecting a power source to a load, the set of power cables comprising an equipment grounding conductor, wherein the AC components present in the one or more phases at the load are injected in the equipment grounding conductor at the load;
- determining an AC current corresponding to each frequency of the one or more AC components present in current in the equipment grounding conductor;
- determining if one or more of the determined AC currents is below an AC threshold; and
- opening a contact in response to determining that at least one of the AC currents is below an AC threshold, the contact disconnecting the power source from the set of power cables.

24. The method of claim 23, further comprising filtering the AC components present in the one or more phases of the set of power cables and injecting the AC components in the equipment grounding conductor.

* * * * *